United States Patent [19]

Needham et al.

[11] Patent Number: 4,577,086

[45] Date of Patent: Mar. 18, 1986

[54] MONITORING IN-SERVICE RESISTANCE OF AC CONDUCTORS

[75] Inventors: James C. Needham, Essex; Robert M. Rivett, Balsham; Raymond A. G. Perryman, Newmarket, all of United Kingdom

[73] Assignee: The Welding Institute, Abington, Great Britain

[21] Appl. No.: 530,657

[22] Filed: Sep. 9, 1983

[30] Foreign Application Priority Data

Sep. 10, 1982 [GB] United Kingdom ................. 8225827

[51] Int. Cl.[4] ............................................. B23K 11/24
[52] U.S. Cl. ................................. 219/117.1; 219/109; 324/62
[58] Field of Search ..................... 219/109, 110, 117.1, 219/108; 324/62, 64

[56] References Cited

U.S. PATENT DOCUMENTS

| 2,508,330 | 5/1950 | Callender et al. | 219/110 |
| 3,558,849 | 1/1971 | Catherall | 219/110 |
| 4,302,653 | 11/1981 | Denning et al. | 219/110 |
| 4,456,810 | 6/1984 | Schumacher et al. | 219/110 |

FOREIGN PATENT DOCUMENTS 1384871  2/1975  United Kingdom ............... 219/110

Primary Examiner—Clifford C. Shaw
Attorney, Agent, or Firm—Martin Novack

[57] ABSTRACT

A method and apparatus of monitoring the resistance characteristics of a circuit carrying an alternating current or a current having an alternating component is described. The apparatus includes first integration or averaging means for integrating or averaging the potential drop for the period between instants when the instantaneous current has the same value in a current loop; and display means for displaying a value representative of the output from the integration or averaging means.

30 Claims, 21 Drawing Figures

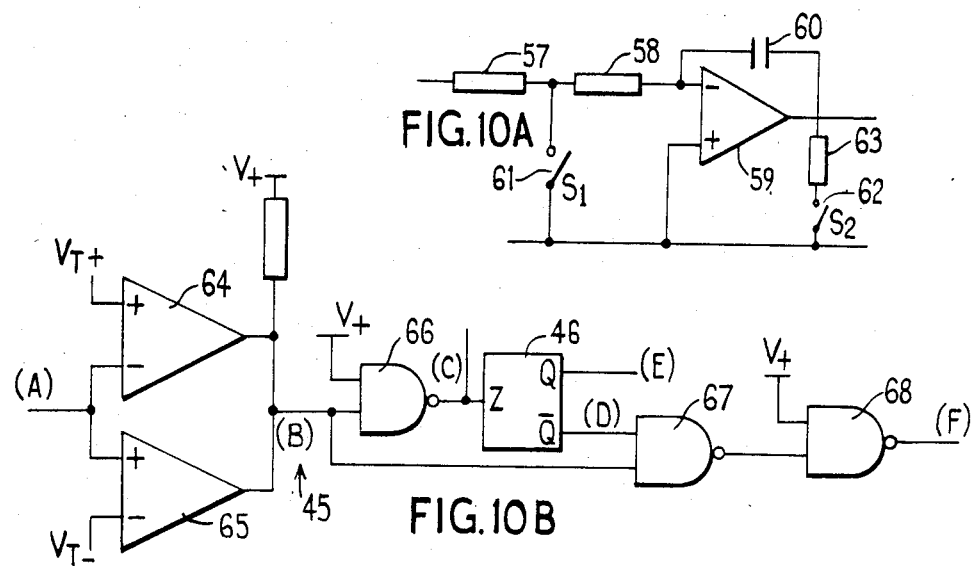
FIG.10A
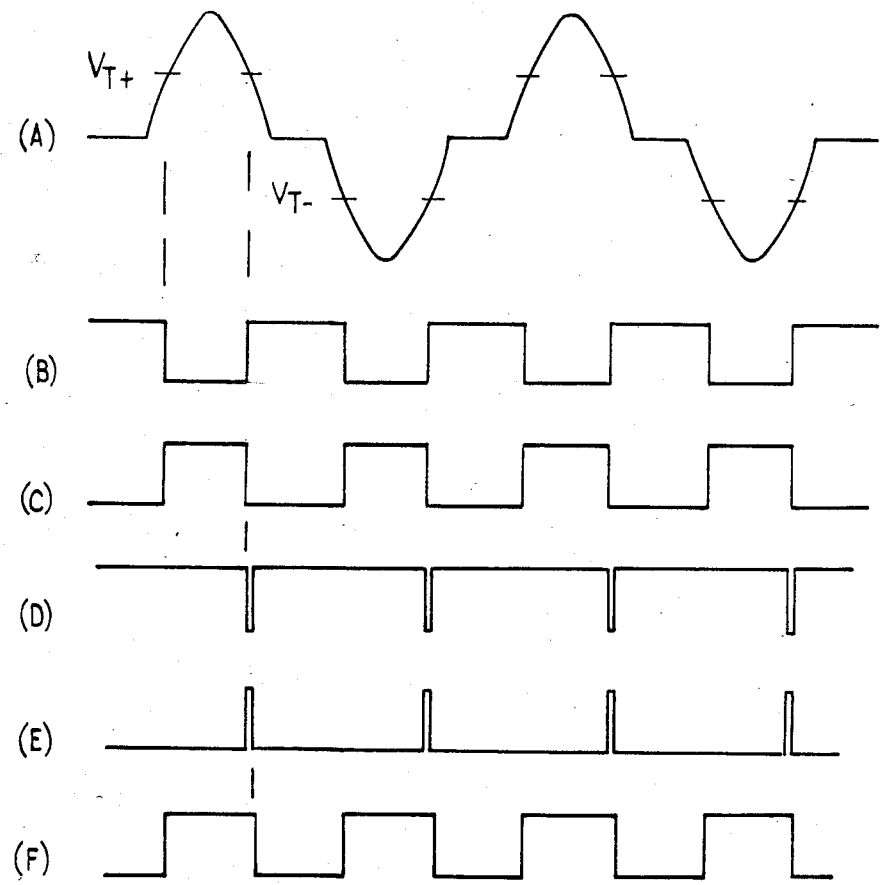
FIG.10B
FIG.11

MONITORING IN-SERVICE RESISTANCE OF AC CONDUCTORS

The invention relates to the monitoring of in-service resistance characteristics of A.C. conductors.

Commonly, resistance is measured by null bridge methods for components which are electrically isolated or detached from their working network. For in-service measurement these techniques are more complex since the existing currents must be suitably compensated for. An example of a case where in-service measurement is required is that of resistance spot welding where the resistance of the spot weld changes during the welding process and requires monitoring. In general, the resistance of a conductor is directly given by the potential drop divided by the operating current. For very low resistances, such as 0.1 mΩ, the currents required to give a reasonable potential drop are high. From this point of view it is convenient to utilise alternating currents since high currents are readily obtained by step-down transformers from the mains supply. However, potential drop measurements are then seriously complicated by the additional reactance drops caused by the alternating current. Such a situation occurs in resistance spot welding. This leads to a false determination of resistance.

In monitoring the quality of resistance welds, particularly spot welds, the instantaneous or cyclic resistance (i.e. the dynamic resistance) of the weld during current flow is used as an index of its size or development.

Various methods have been proposed for monitoring (and hence also for controlling) the quality of a resistance spot weld based on the variation in resistance throughout the weld period. In general terms, especially for mild steel, the resistance increases steadily (after the first initial period when the interface resistance collapses and significant flow occurs) largely due to the heating up of the material between the electrode tips. In due course, the resistance falls either suddenly as when the weld splashes, or more progressively as the electrodes indent into the heated sheets giving some reduction in through thickness and increased cross-sectional area for contact.

In one monitor system the weld has been deemed satisfactory if the resistance falls by a finite percentage from its highest value occurring in the main welding period. The same approach has been used to terminate the welding current after such proportional change in resistance has taken place. Similar systems have utilised, instead of resistance of the weld zone, the potential drop across the weld since, with a nominally constant current, variations in resistance are reflected in corresponding variations of electrode potential.

In one recent example of this approach the electrode potential has been multiplied by a factor proportional to the reciprocal of the mains supply voltage in order to compensate for the effect of variations in the supply voltage on the electrode potential (due to the corresponding variations in overall working current). This particular source of disturbance or error does not occur where true resistance is being derived from the electrode potential divided by the operating current.

However, in all these systems there is difficulty in determining the relevant electrode potential since it is relatively small (about 1V) and it is generally impracticable to take potential leads close to the electrode tips. In practice, it is preferable for the potential leads to be remote from the electrode tips but this introduces two sources of error. Firstly the increased resistance path of the welding arms (in addition to that due to the spot weld itself) is such that changes in the resistance of the spot weld are proportionally less in the overall resistance. Secondly, there are reactive voltage drops in the arms (as well as the possibility of electromagnetic pick up in the potential detecting leads) which are superposed on the true potential, giving a distorted signal. In practice, the errors can be comparable with, and in the extreme, an order of magnitude greater than the true resistive potential so that monitoring and control based on so-called electrode potential or weld resistance are subject to errors leading to false interpretation.

In accordance with the present invention, a method of monitoring the resistance characteristics of a circuit carrying an alternating current or a current having an alternating component comprises obtaining the integral or average of the potential drop for the period between instants when the instantaneous current has substantially the same value in a current loop.

In general, the potential drop (V) along a conductor having resistance (R) and inductance (L) and carrying an instantaneous current (i) is given by:

$$V = iR + \frac{Ldi}{dt} \tag{1}$$

It can be seen from this equation that where there is significant inductance (L) then the potential drop (V) will not be directly proportional to resistance (R). However, integration of equation (1) leads to:

$$\int V dt = R \int i dt + L \int di \tag{2}$$

Thus if the potential integral is determined between instants when the current has the same value in the current loop then the second term on the right hand side of equation (2) will be zero and the effect of inductance will be eliminated. Furthermore, for corresponding currents the integral in the first term on the right hand side of equation (2) will be constant, and hence the integral of the potential will be directly proportional to resistance (R) and thus will enable resistance to be monitored.

Conveniently, the current loop may comprise a half cycle although more than one half cycle may occur between successive instants especially for direct current having an alternating component.

Preferably however, the average potential between the two instants is determined by dividing the potential integral by the time interval between the two instants. This eliminates the effects of any discrepencies between the time periods between separate pairs of instants.

If it is desired to obtain an absolute value for average resistance (R) then the method may further comprise dividing the integral or average potential by the corresponding integral or average of the current between the same instants.

Thus, with the invention, potential drop measurements are possible in the presence of high operating currents (and hence the on-load resistance of a conductor) and with nominally negligible error by ensuring that such readings of potential or resistance are taken such that the effects of inductance are cancelled out or eliminated.

In one example, the instants occur at successive times in the curretn loop when the current is substantially zero. This is particularly suited to eliminating the potential distortion due to inductive voltages and due to induced pick-up voltages by ensuring that readings of potential, and when necessary current, are taken over a significant period, that is a half cycle so that the value of resistance is substantially averaged especially if it is subject to change during the half cycle.

As has been outlined, this method involving a significant time interval between the two instants is advantageous but, for a continuous alternating current wave, the instant of zero needs to be carefully determined. For this a standard current transformer can be used with a load comprising two semiconductors back to back and a parallel resistor. For example with a 20Ω load and parallel diodes the load voltage on the transformer is some 1–2V with sharp polarity reversals over the period when the current is less than 1% of the nominal peak rating. In practice the current zero can readily be detected within about 0.1% using conventional electronic comparators. This system is also suitable for current which has an alternating component with a significant current zero pause (as is commonly practiced for heat control in resistance welding) since the current zero levels are clearly apparent. The integral or integrals can be determined between successive instants each falling within the corresponding current zero period of a successive pair. For example, the start of the integration periods can be nominally 20 milliseconds apart (for a 50 Hz waveform) and falling within the current zero periods of a chopped (phase delay controlled) current wave, while the integration is maintained (for 10 milliseconds) to embrace the current loop. Alternatively, the integration period may commence at the start of a current loop and be maintained for a sufficient time e.g. 9 milliseconds for a 50 Hz supply to embrace the whole current loop to the next current zero pause.

Another method for detecting the start of a current loop including current zero pauses between successive loops is to use the output of a toroid positioned about a current carrying portion of the circuit as is commonly carried out in connection with resistance welding. The toroid gives a signal output proportional to the rate of change of current and this output is normally integrated in order to re-establish the true current waveform (and hence the values of peak current, rms current and so forth). The toroid output voltage is high both at the start and end of a current loop but zero during the current zero period. Thus the major discontinuities in toroid voltage clearly mark the zero current ends of the current loop. Thus, the toroid output signal can be used to open and close suitable electronic gates as the signal sharply deviates from and to zero, the elctronic gates allowing the integration of the instantaneous potential and, where appropriate current, over the period concerned. As the toroid output voltage also changes continuously and reverses in polarity during the current loop, care must be taken to ensure that the gating for the start of integration relates to the major discontinuity, and not to any other crossing of zero level. A logic discrimination can be used where the current must also be low or zero for the start of integration. Alternatively, the rate of change of the toroid signal can be used to select the appropriate start gate. For example the toroid output voltage can be half wave rectified and then differentiated so that only the fast transient rise from zero initiates the integration period to provide integral values once in every cycle. Furthermore the toroid output voltage can be full wave (bridge) rectified and differentiated to provide integration (from the start of both positive and negative current loops) for nominally less than 10 milliseconds at 50 Hz mains supply.

In another example, the instants occur at successive times in the current loop when the current value is substantially the same and non-zero. This value or level can be detected by directly monitoring the current in the current loop, suitable electronic gates being opened and closed as the current passes the given level.

The current level in this example may be set as an absolute level or as a finite level below the peak or as a proportion of the peak current.

For integral potential and corresponding average resistance measurement over part of the current loop several methods can be used. For example a simple level detector can be used such that integration occurs over the period where the instantaneous current is greater than the threshold. This is suitable for threshold currents up to say 50% of the peak, but for higher thresholds, corresponding to shorter integration periods about the peak, it is preferable to set the threshold with respect to the peak current in a previous cycle. Fluctuations in overall current then have a lesser effect on the integration period. Equally the threshold can be defined as a fraction of the peak current where again the integration period is approximately constant for moderate fluctuations in overall current.

As an alternative to monitoring the current directly, a toroid can be used in a similar way to that outlined above. As the current approaches its peak value, the rate of change will approach zero. Thus, the output signal from the toroid, which represents rate of change of current, can be monitored and thresholds for this signal can be determined equivalent to the desired non-zero current values.

In another approach based on timing rather than level detection the integration period can be initiated after a set time delay from the start of current flow, where the latter is given by the major discontinuity in toroid output or by a current transformer. The integration period is then maintained for twice as long as the time taken for the toroid signal to reach zero. The time to reach zero toroid voltage can be represented by the charging of a capacitor which then is discharged at the same rate to give the corresponding further time interval.

Conveniently the interval between the instants is short and preferably lies in the range 1 to 3 milliseconds. This shortens the integration period allowing greater accuracy. In this case, where the integration period is concentrated around the current peak, the detection of specific levels of current is not usually sufficiently precise. The integration period is therefore preferably based on the above mentioned toroid signal. The toroid signal output changes from one polarity to the other as the instantaneous current approaches and recedes from its peak. Also the instant of zero toroid output corresponds exactly with the moment when the alternating current is stationary (zero rate of change) at its peak. This method is accurate since the peak toroid voltages during the rise and fall of high alternating currents are typically several volts or even several tens of volts.

Conveniently, where a toroid is used, the integration period can be defined by the toroid signal output passing through zero between two equal and opposite threshold levels. To ensure that the gating refers to the peak current period, a logic circuit detects that the current is also greater than zero or greater than a minimum level. Yet again a subsidiary integration of the toroid signal can be initiated when the toroid voltage falls below a given threshold. The integration of potential (and corresponding current) is maintained until the subsidiary toroid voltage integrator reaches zero at which point the main integration is closed.

Preferably the interval between the instants is less than 300 microseconds. In this case, and where greater precision is desirable, the toroid may be used, and the toroid output voltage can be amplified and compared with threshold gates of say ±1V to give short integration periods closely embracing the current peak. Integration periods (intervals between the instants) of less than 1 millisecond can conveniently be achieved down to about 0.1 milliseconds about the current peak.

In one particularly convenient example, the instants are substantially coincident, the method comprising measuring the potential substantially at the current peak, then, where required, dividing the measured potential by the peak current. This effectively represents one limiting case of the invention where the interval between the instants has been reduced substantially to zero.

The advantage of using instants close to or at current peak is that, for example in resistance welding, the current can be very rapidly modulated in response to the monitored resistance characteristics within a half cycle.

Once again, the use of a toroid is particularly convenient in this case, the output of the toroid operating a gating system such that, when the toroid output is changing from positive to negative (or vice versa), the apparent potential drop is sampled at the instant the toroid voltage is at or close to zero. The integral of the toroid signal output can also be used to derive the operating current and hence the value of the current peak. The instantaneous resistance at current peak is then given by the sampled potential divided by the peak current.

This method of determining resistance at the instant when current is stationary and at its peak value has the advantage that the relevant signal levels are at their maximum and hence the effects of residual error are minimised. In effect, the "integral" or average has been taken over an infinitesimally small time interval.

On the other hand the advantage of using the integral of potential and where required current, is that the resistance is averaged over the period of the integration, rather than given by a single instantaneous value such as that derived by the ratio of potential to current at the instant of current peak, and the effect of spurious changes in resistance are minimised.

The methods of the various aspects of the invention can be applied to both heavy current conductors and equipment of any resistance/inductance combination without requiring adjustment for the different degrees of phase lag or power factor.

One application of in-service resistance characteristic monitoring is where flexible conductors are used to carry heavy currents, particularly where the flexible conductors are continually being moved about. Such mechanical movement, as when the flexible conductors form part of a moving machinery or a robot installation, leads to fretting and damage of the flexible conductors. In the extreme, such fretting leads to overheating due to reduction in effective cross section, which is a possible hazard to the flexible conductor and may also impair the current supply to the load. Such flexible cables can be monitored by monitoring their resistance characteristic in the manners described to see if it has increased significantly over that for newly installed or undamaged conductors. The invention is particularly applicable to where such conductors carry heavy alternating current, but is also applicable with heavy d.c. where there is appreciable ripple in the nominally unidirectional current. Thus measurement of the potential drop at the instant when the current is at its peak in the ripple waveform, that is when the instantaneous rate of change is zero, or measurement of the potential and current integrals between two instants when the current is at substantially the same level in the ripple waveform, allows the resistance to be determined in spite of the presence of induced voltages and inductive elements associated with the alternating component in the waveform. Equally, the integrals can be taken over the complete period of the d.c. pulse from zero to zero current, or between two substantially identical current levels embracing any number of complete current ripples and so forth.

The methods can also be applied to other mobile systems such as moving crane and gantry systems where power supplies are provided via flexible cables to the power operated equipment.

These methods of deriving integral potential drop and/or resistance do not rely on the knowledge of inductance or relative phase angle or on a means for counteracting the inductance by balancing out the quadrature component as in bridge techniques, and can be applied to measurement of resistance in a circuit of any resistance/inductance ratio.

Some examples of a method and apparatus in accordance with the present invention will now be described with reference to the accompanying drawings, in which:

FIGS. 10a and 10b illustrate parts of the circuit shown in FIG. 9; and,

FIG. 11 is a pulse diagram illustrating operation of the circuit parts illustrated in FIGS. 10a and 10b.

Figure 1:
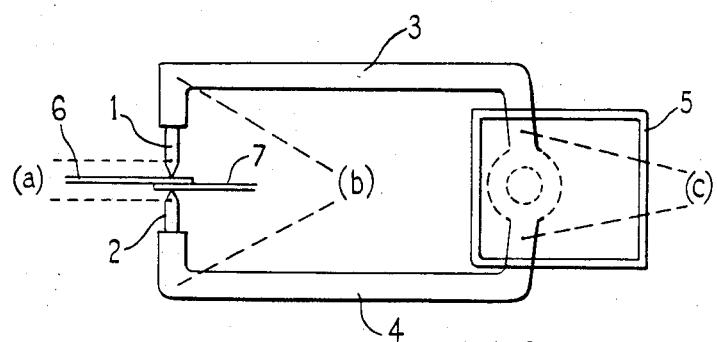
FIG. 1 is a schematic diagram of part of a resistance welding system.

FIG. 1 illustrates schematically part of a resistance spot welding system comprising a pair of electrodes 1, 2, mounted in respective machine arms 3, 4. The machine arms 3, 4 are supported by a conventional housing 5. In use, a pair of workpieces 6, 7 is positioned between the electrodes 1, 2 and an alternating electric current is applied to the circuit containing the electrodes 1, 2, causing the formation of a spot weld. In order to monitor the formation of a spot weld, it is conventional to monitor the variation in apparent resistance in the circuit carrying the alternating current.

Figure 2:
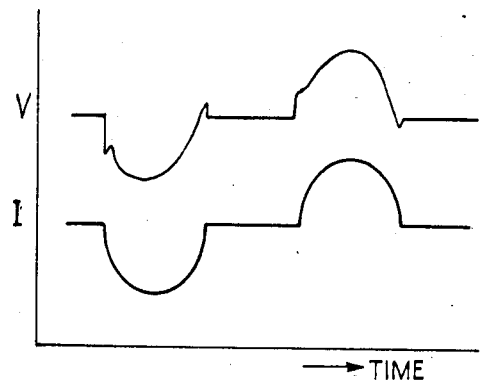
FIGS. 2a–2c illustrate the variation of potential difference and current with time at three different positions in the welding system illustrated in FIG. 1.
Figure 2:
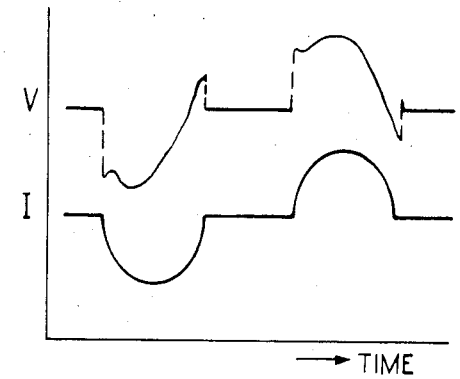
Figure 2:
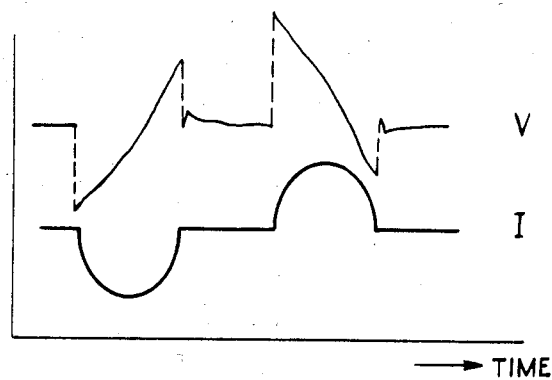

It is convenient at this stage to compare the apparent potentials at positions close to the workpieces 6, 7 of for example sheet steel being welded or more remote from the electrodes 1, 2. A typical wave form of the potential difference (so called electrode voltage) between the points a is illustrated in FIG. 2a. The current wave form (I) shows distinct zero pauses (corresponding to a low relative heat or large phase delay condition) in the sinusoidal form. The corresponding potential (V) has a similar sinusodial form except for the clear discontinuities (at the beginning and end of the current loop) which are partly due to inductive components. For the second positions b, which are somewhat remote from the electrodes 1, 2, the potential wave form shows considerably greater discontinuities in addition to the approximately sinusoidal form (FIG. 2b). The potential drop as sensed at the positions c (remote from the electrodes 1, 2, viz. in the throat of the machine) is severely disturbed such that the sinusoidal form is lost in comparison with the inductive distortion (FIG. 2c). It should be noted that, in this case, the peak voltage is that due to the inductive elements and is in no way related to the true resistive drpp. The average potentials corresponding to the current loop are for the three positions approximately 0.76V, 0.86V, and finally about 1.21V at the rear of the machine arms. (Note the average potential takes account of the potential reversal in the given current loop). The potential drops corresponding to current peak are for the three positions approximately 1.2V, 1.35V and finally about 1.9V at the rear of the machine arms 3, 4 (compared with a maximum inductive spike of around 4V).

Figure 3A:
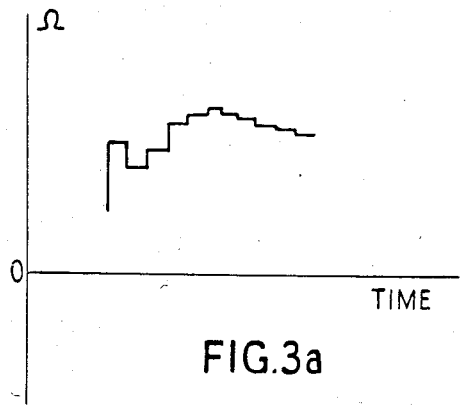
FIGS. 3a–3c and FIGS. 4a–4c illustrate variations in resistance in the circuit under various conditions.
Figure 3B:
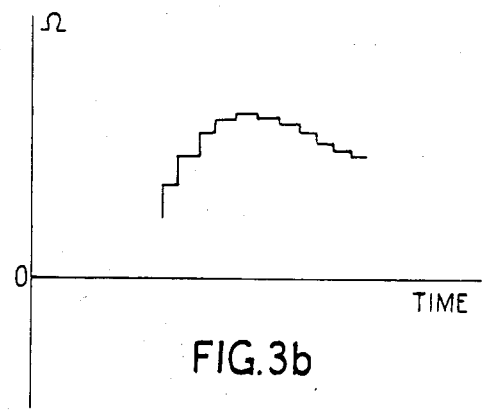
Figure 3C:
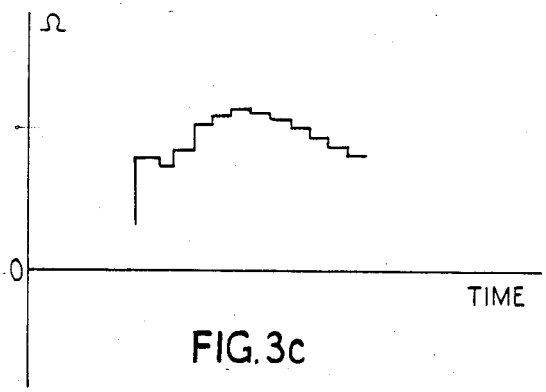

If, as has been practised in the past, the maximum potential drop in the current loop is used to define the resistance, then during the development of the resistance spot weld the dynamic resistance as measured close to the electrode tips shows a typically rising and subsequently falling characteristic, as illustrated in FIG. 3a. It should be noted that the first cycle of welding current shows a higher apparent resistance than the minimum. This is due to the initial breaking down of the interface which gives rise to an initial extra voltage surge at the beginning of the first current half cycle. This is eliminated by the method of resistance measurement at or around the current peak in accordance with the invention whereby a similar rise and fall is indicated but without the spurious initial resistance being registered (FIG. 3b). It is also largely suppressed for the method of resistance measurement over a complete current loop (FIG. 3c).

Figure 4A:
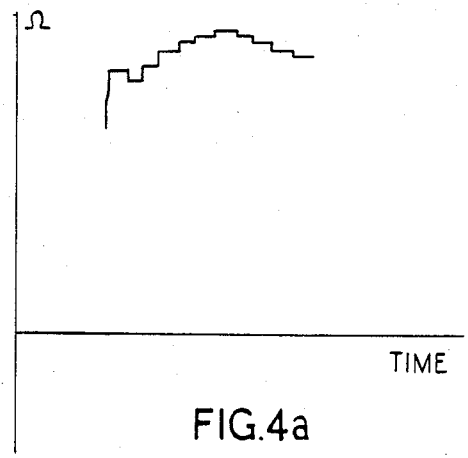
Figure 4B:
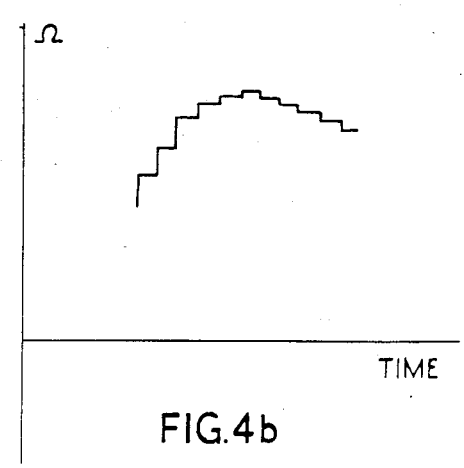
Figure 4C:
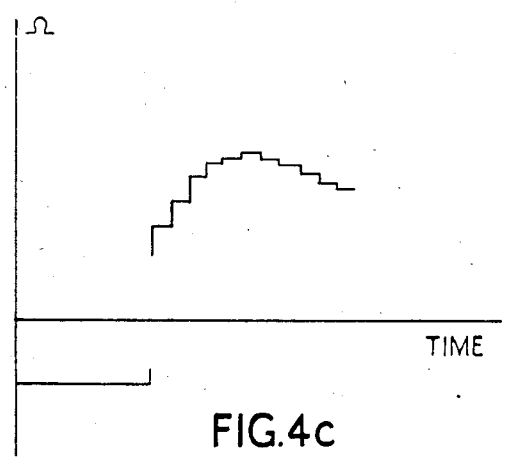

Moreover, since it is not practical to take potential measurements from close to the electrodes, the apparent resistance as recorded from further away through the development of the spot weld does not show such a distinctive rise and fall (FIG. 3a) but shows a greatly decreased change (FIG. 4a). This decreased sensitivity is a function of both the extra circuit resistance involved by taking the potential drop measurement remote from the electrodes 1, 2 and by the errors introduced by the inductance components. With the proposed method of potential (and resistance) measurement around or at the instant of current peak, the rise and fall of resistance at the rear of the machine is substantially the same (FIG. 4b) as that for when the potential is measured close to the electrodes tips (FIG. 3b). Moreover the additional resistance represented by the machine arms 3, 4 can be offset as shown in FIG. 4c such that the percentage rise and fall of the apparent resistance measured at a point remote from the electrode tips is substantially the same as that measured close to the electrode tips (see FIG. 3b). Diagrams similar to FIGS. 4b and 4c, but exhibiting the effect of the initial extra resistance can be drawn for measurement over all of the current loop. However for measurement over part of the current loop, the initial resistance due to the interface is less obtrusive.

The effect of the machine arms 3, 4 and the like can be readily eliminated by setting the degree of offset (or pre-biasing) in tests with a sheet of copper in place of steel between the electrode tips. Short circuit tests of this nature can also be used to determine whether the machine is overheating due say to inadequate water cooling under the conditions of use. Thus on a given test or series of tests the short circuit resistance increases significantly compared with that for the machine at substantially room temperature, if the machine is heating up. A similar test can also be conducted with respect to the primary of a resistance welding machine to determine whether the latter is being overheated under load.

The possibility of virtually true resistance measurement at a point remote from the electrode tips greatly aids the viability of both monitoring and feedback control techniques based on the potential or resistance characteristics of the weld. Not only is it more convenient for the potential connections to be made at the throat or rear end of a resistance welding machine, but it enables for example roll spot welding to be readily monitored since the need to make potential measurements close to the wheel electrodes is circumvented. In roll spot welding where the electrode wheels are stationary during the making of the weld, the change in resistance during the welding period is similar to that obtained in resistance spot welding. Thus with measurement at the rear of the machine arms 3, 4 the resistance of the latter can be offset as previously described. Then the change in resistance through the weld period shows a characteristic rise and fall similar to that shown in FIG. 4c.

Figure 5A:
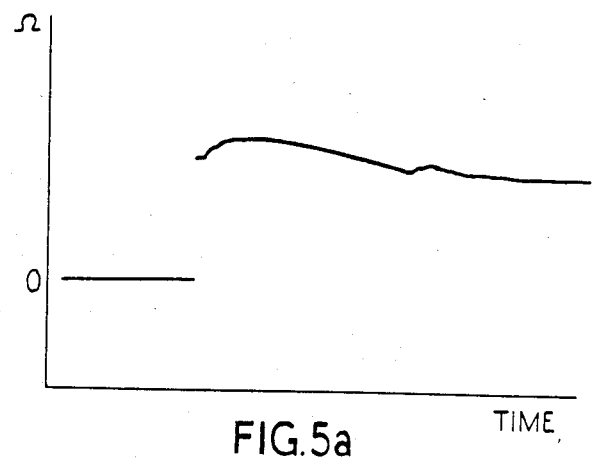
FIGS. 5a–5c illustrate the variations of total resistance, machine resistance, and weld resistance respectively during formation of a seam weld as determined by a method in accordance with the invention.
Figure 5B:
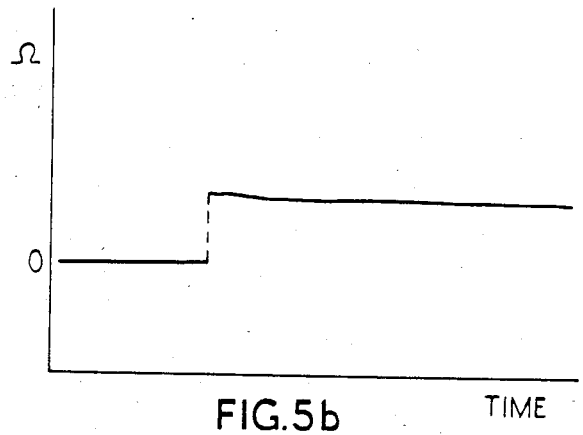
Figure 5C:
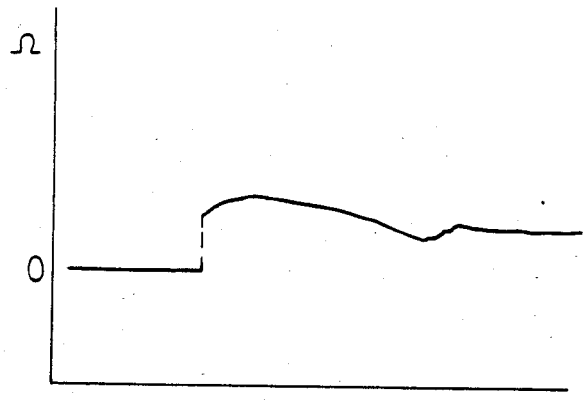

For continuous seam welding the initial resistance at start shows a similar rise and fall as the work is heated and thereafter maintains a virtually constant level with continuous current, FIG. 5a. The resistance of the seam welding machine alone is indicated by a short circuit test, FIG. 5b, and the corresponding increase in resistance while welding 1 mm thick mild steel sheets 6, 7 is shown in FIG. 5c. (The duration of the initial stage of rise and fall in resistance is a function of the welding speed and decreases at higher speeds). Thus allowing for the offset for the machine resistance, the true effective resistance of the work, as indicated in FIG. 5c, is given for each cycle of alternating current, either as the resistance determined at the instant of current peak, by sampling at that moment, or as the resistance determined throughout the current loop (by integrating the potential between zero current instants as previously described) or as the resistance over part of the current loop between corresponding levels. The resistance so determined can also serve as a monitor of the process. For example, with reduced current, the work is heated but a true weld is not developed between the sheets. Under these conditions the initial resistance shows a similar rise but without the fall to the correct equilibrium level. It is noted that the running resistance under these conditions is some 25% (and more) greater than the equilibrium resistance for a properly developed seam weld with interface nugget fusion. With methods in accordance with the invention, it is possible to detect weld splash at the start of welding, weld quality while welding, the incidence of surface eruptions of the weld while welding, the presence of surface contamination and appropriate corrections can be made automatically to the welding current. Also for spot welding the number of sheets can be detected and the welding schedule amended to suit.

This system can also be conveniently applied to gun welders and to resistance welding machines attached to robots and the like with the potential drop measurement taken from any convenient access point.

Equally, the conductive quality or operating performance of sliding and rotary connections carrying heavy current can be monitored in situ, such as the connection bearings in seam welding machines.

With respect to resistance welding it should be noted that, in many machines, the operating current and hence the effective heating is controlled by introducing a degree of phase delay to the thyristor or ignitron controlling the primary. With increasing phase delay not only is the period of current flow in each half cycle reduced but the current peak is also diminished. Thus the heating due to the square of current falls off rapidly with increasing phase delay. However it should be noted that during the current zero pause the rate of change of current is also zero. Therefore it is sometimes necessary to ensure that the electrode or machine potential is registered near or at a true current peak where the instantaneous current is greater than zero together with low or zero rate of change. In one embodiment of the systems described, a logic gate is released only when current is flowing and for the short period while the rate of change of current is close to zero.

Similarly, in the methods based on integrating over the whole current loop, it is necessary to ensure, if using rate of change of current to indicate start and end of the integration period, that the electrode or machine potential is integrated between two points where the rate of change departs from and returns to zero together with the instantaneous current being substantially zero at the same moment. In one embodiment of the system described, a logic gate is closed only when current is flowing (or not zero) and over the period while the rate of change of current is substantially not zero.

Figure 6:
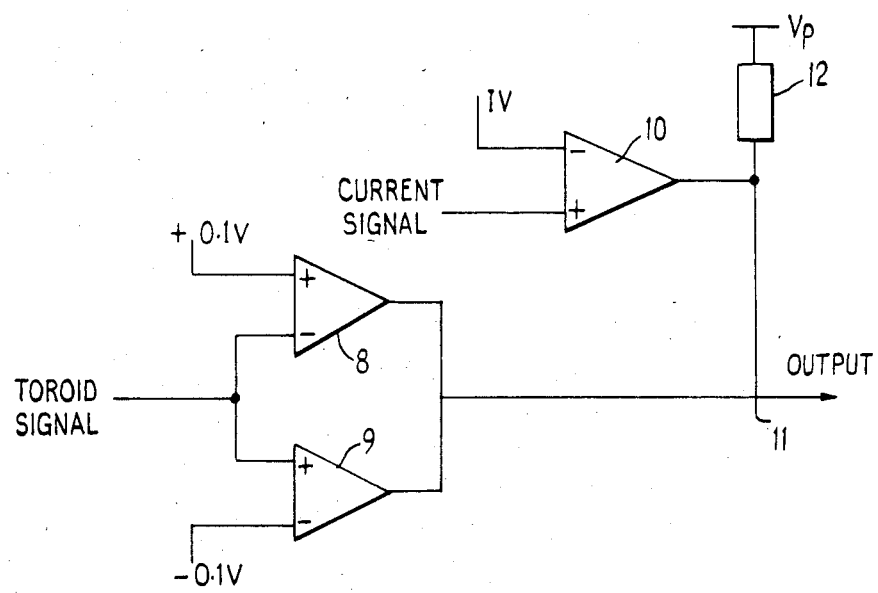
FIG. 6 illustrates a gating system for determining zero rate of change of current.

FIG. 6 illustrates a gating system for determining the time of occurence of zero rate of change of current. This gating system is for use in the method in which the potential drop is determined at peak current i.e. zero rate of change of current. To monitor the rate of change of current, a toroid (not shown) is provided around one of the machine arms 3, 4, the output of which is fed to a pair of comparators 8, 9. A fixed voltage of 0.1 volts is applied to the positive input of the comparator 8 while a fixed voltage of −0.1 volts is applied to the negative input of the comparator 9. The current flowing in the circuit including the electrodes 1, 2 is applied to the positive input of a comparator 10. A fixed voltage of 1 volt is applied to the negative input of the comparator 10. The outputs of the comparator 10 and of the comparators 8, 9 are connected to a point 11 representing the output of the gating system. A fixed voltage $V_p$ is applied to a resistor 12 which is connected to the point 11.

As can be seen from FIG. 6, the comparators 8, 9, 10 must all be off, i.e. open collector, for the output at the point 11 to rise to the level $V_p$. If the toroid signal is more positive than +0.1 volts or more negative than −0.1 volts, or if the integrated toroid signal, viz current is not greater than 1 volt then the comparator concerned draws current through the common resistance 12 and the output is held low.

Typically for current measuring toroids as used in resistance welding, the output is $\sqrt{2}V$ rms for a 50 Hz, 1000A rms sine wave. Thus at 10 kA peak 50 Hz sine wave, the peak toroid output is $10\sqrt{2}V$. At current peak the rate of change of the toroid voltage is therefore $2\pi f\ 10\sqrt{2}$ V/sec (for 10 kA) where f is the supply frequency, viz 50 Hz. Thus the time interval for the sampling pulse governed by the threshold voltages on the comparator gates 8 and 9 i.e. ±0.1V, is $$\frac{0.2}{1000\sqrt{2}\ \pi} \text{ sec,}$$

or about 45μ sec which corresponds to less tnan one electrical degree about the current peak. Although a short sampling pulse at current peak as described is advantageous the system is not limited to such a short duration sample only. For example with a much lower current, or with a less sensitive gate the sample pulse could correspond to say ±5° around the current peak, without introducing serious error, especially if the potential sensed (or resistance derived) during the sample is averaged over the sample period (i.e. about ½ ms), as already described.

Figure 7:
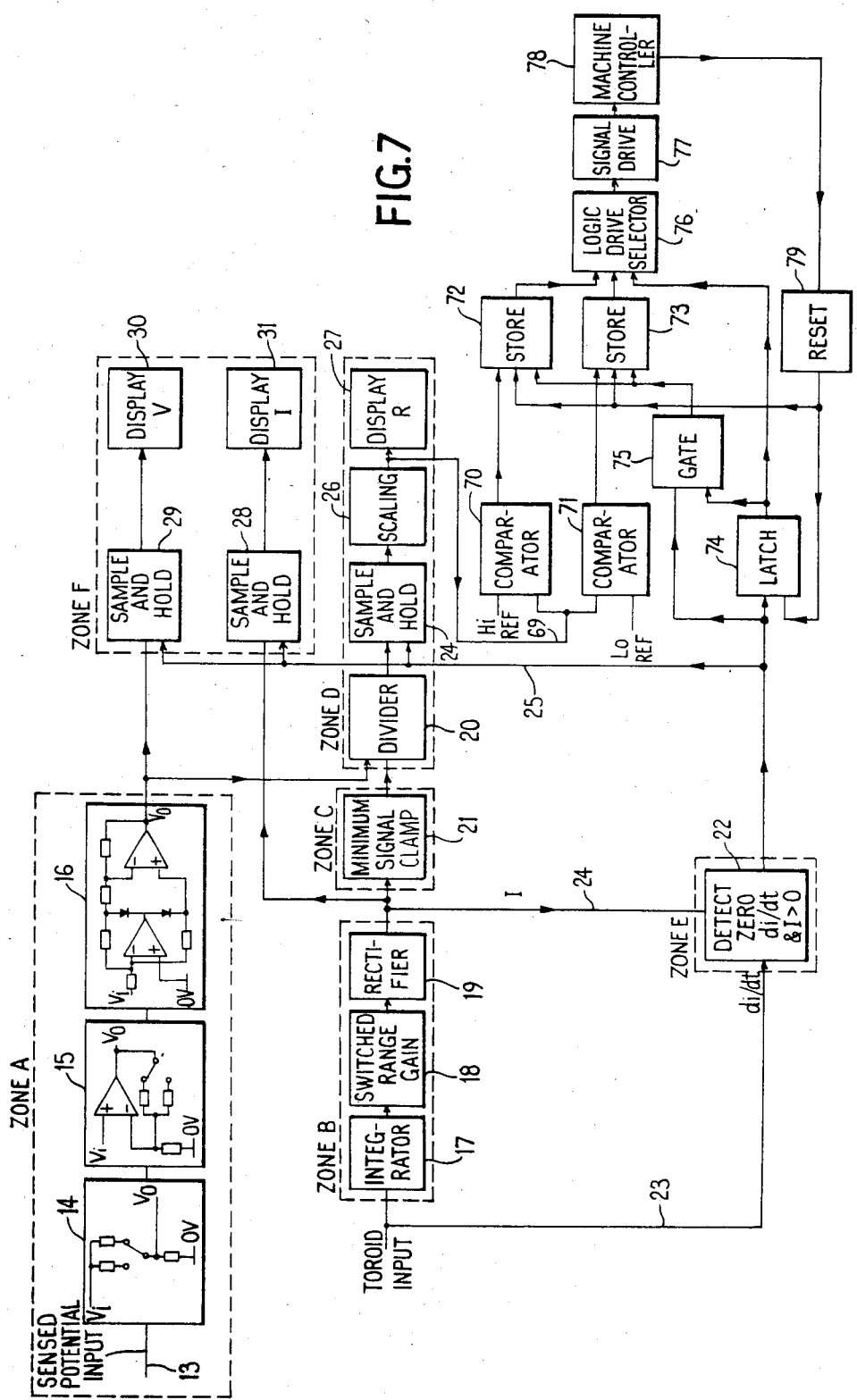
FIG. 7 is a block diagram illustrating apparatus according to the invention for monitoring resistance at peak current.

Apparatus for providing an output representative of resistance at current peak is illustrated in FIG. 7. The sensed potential is fed along a line 13 to the switched range divider 14 the output of which is supplied to a switched range gain 15 the output of which is fed to a rectifier 16. These three components form zone A of the circuit which effectively scales the input potential and applies signal rectification. The output from the toroid, representing rate of change of current, is fed to an integrator 17, the output of which is fed to a switched range gain unit 18 the output of which is fed to a rectifier 19. These three components represent zone B of the circuit which effectively scales and rectifies the current signal so that suitable signals are provided to a divider 20 comprising zone D, the output of which is proportional to the signal level from zone A divided by the signal level from zone B.

To prevent spurious readings when the alternating current is low, a preset level is superposed on the current signal by a minimum signal clamp 21 in zone C. The output from the divider 20 which represents resistance is sampled at the moment corresponding to current peak via the discriminator of zone E. Zone E comprises a gating system 22 similar to that shown in FIG. 6. The toroid output is applied to the gating system 22 along a line 23 while the integrated and rectified toroid signal is applied to the gating system 22 along a line 24. The output from the gating system 22, which comprises a signal when the toroid output signal passes through zero is applied to a sample and hold unit 24 via a line 25. The output from the unit 24 is fed to a scaling unit 26 whose output is displayed by a conventional display means 27. The sample and hold unit 24 samples the output signal from the divider 20 when a signal is applied along the line 25 corresponding to a current peak. At the same time, the signal on the line 25 is applied to sample and hold units 28, 29 which are similar to the unit 24 and sample the rectified potential output from zone A and the rectified current output from zone B at the instant of current peak. Conventional display means 30, 31, display the sampled potential and current respectively. The monitored resistance is used to control welding current as will be described later.

In an alternative arrangement (not shown), the instant of potential sampling is given by a logic combination of both the rate of change of current close to or at zero together with a finite slope to the toroid signal from positive to negative or vice versa. In other words, the second differential of the instantaneous current must be finite at the instant that the first differential is zero.

Figure 8A:
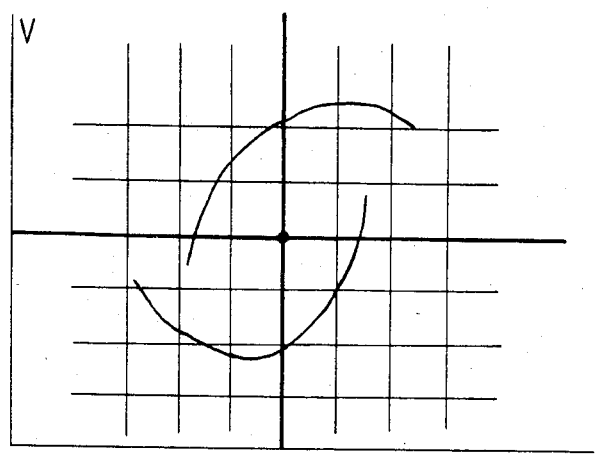
FIGS. 8a and 8b are cyclograms illustrating the variation of potential drop with rate of change of current.
Figure 8B:
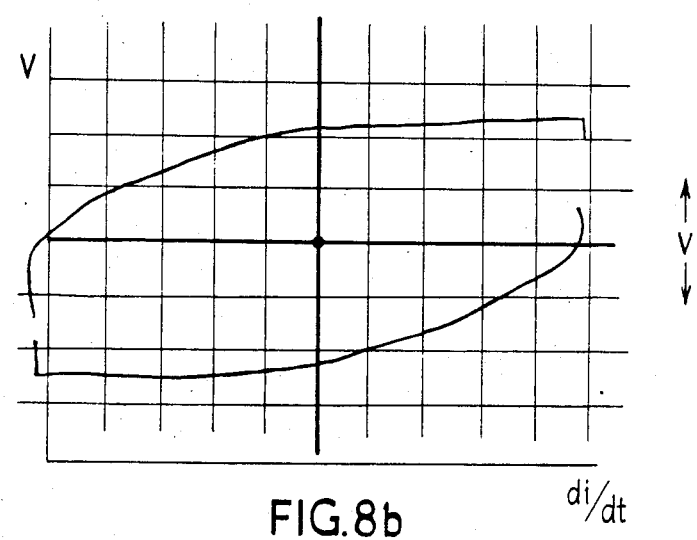

In yet another arrangement, the instantaneous potential as derived by the unit 15 is conveniently displayed on an oscilloscope with one axis representing potential and the other representing toroid voltage. The magnitude then of the voltage on the potential axis at the instant of zero on the other axis is the true resistive drop. Thus as shown in the cyclogram, FIG. 8a, where the origin corresponds to the periods of zero current and zero potential in the chopped current wave (such as shown in FIG. 2c), the ellipse describes the relation of potential to rate of change of current throughout a cycle of current. The magnitude on the potential axis is readily determined and, where necessary, compared with the potential drop under standard conditions, such as when monitoring for deterioration in a cable. Equally, for greater accuracy, the signal representing rate of change of current can be amplified so that the ellipse approximates to a line crossing the potential axis, FIG. 8b. Also, for greater precision, the potential signal to the oscilloscope can be offset by a finite amount and the oscilloscope deflection further amplified so that values of instantaneous potential at current peak can be readily determined to an accuracy of better than 1% or even 0.1% error.

Figure 9:
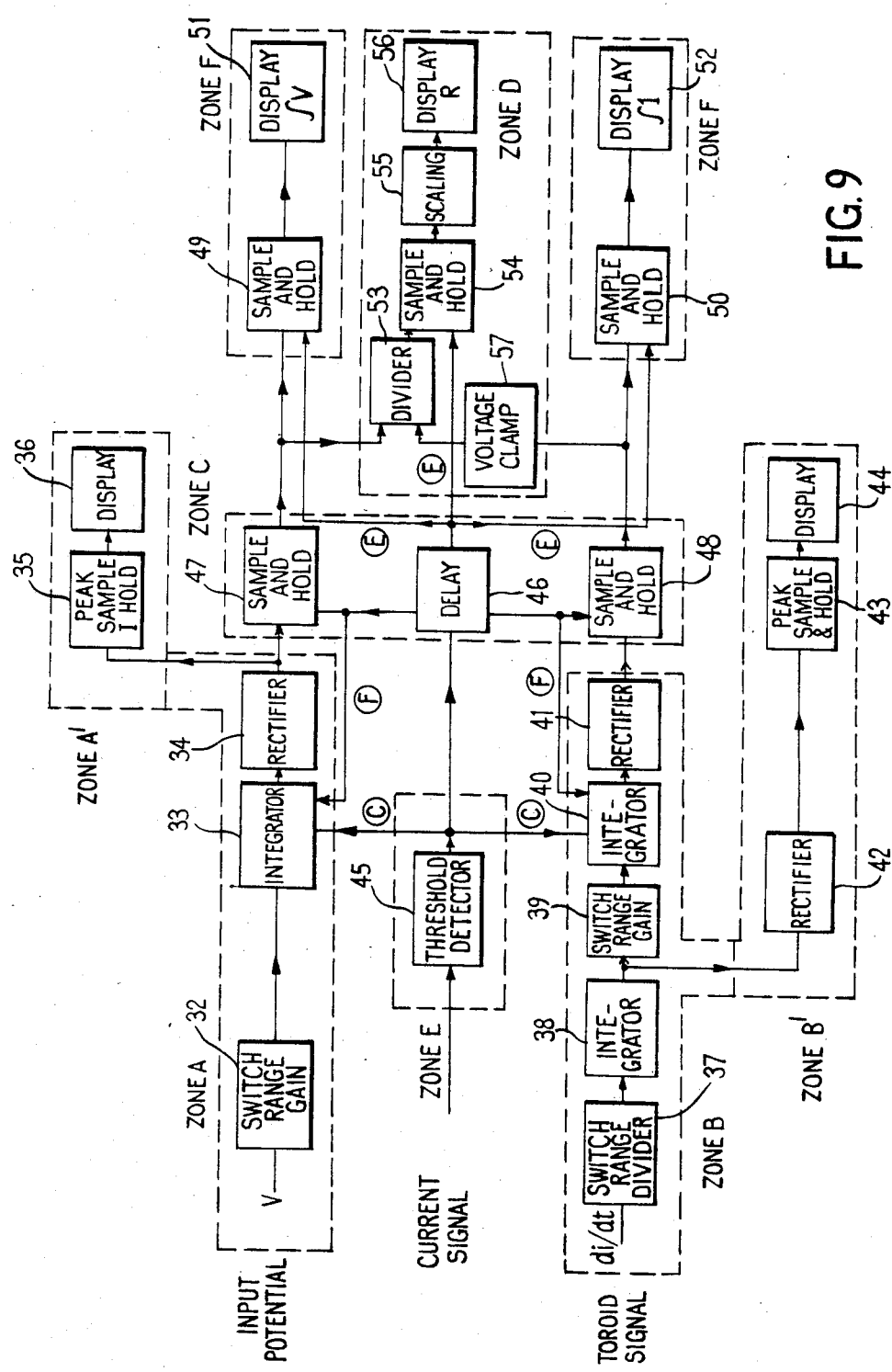
FIG. 9 is a block diagram similar to FIG. 7 but illustrating apparatus for monitoring resistance over a finite period.

FIG. 9 illustrates apparatus for deriving integral potential and integral current together with average resistance as opposed to the determination of potential at current peak which is achieved by the apparatus shown in FIG. 7. The apparatus shown in FIG. 9 comprises a switch range gain unit 32 to which the instantaneous potential V is fed, the output from which is fed to an integrator 33 which in turn feeds a rectifier 34. These form zone A in the circuit. The rectifier 34 can be omitted if the appropriate polarity is obtained for the input signal V. A subsidiary circuit zone A' which comprises a peak sample and hold unit 35 connected to a display 36 ensures that the integrator 33 is not overloaded or saturated. The output of the rectifier 34 is fed to the peak sample and hold unit 35. (In general, particularly with integration over a whole current loop and potential connections including significant inductance, the integral potential passes through a peak which is appreciably greater than the final integral at the end of the current loop).

Again, as in previous cases, a toroid (not shown) is provided around one of the machine arms 3, 4 the output signal of the toroid representing the rate of change of current in the electrical circuit. The toroid signal is applied to a switch range divider 37 the output of which is fed to an integrator 38. The output of the integrator 38 represents the magnitude of the current and this signal is fed to a switch range gain unit 39 the output of which is fed to a further integrator 40 and from there to a rectifier 41. These together form zone B of the circuit. Again, the rectifier 41 can be omitted if the signal polarity is correct. Again, a subsidiary circuit zone B' is provided for detecting and displaying peak current. The output from the integrator 38 is fed to a rectifier 42 the output of which is fed to a peak sample and hold unit 43 whose output is displayed by display unit 44.

The period of integration is determined by a threshold detector 45 forming zone E of the circuit, where, at the end of the integration period, the integral value is held as required. The current signal is fed directly to the threshold detector 45 whose output is fed to the integrator 33 and the integrator 40. For integrating over a whole current loop, the threshold can be set close to zero and the appropriate current signal suitably amplified. For example, the secondary of a current transformer can be connected to a relatively high load such as 20Ω (which is shunted by diodes back to back) so that the current transition through zero is clearly shown by the voltage reversal across the load resistor. Thus the integration is carried out over the period where the voltage across the load resistor is greater than the threshold values such as 0.1V.

The output from the threshold detector 45 is also fed to a delay circuit 46 and to tracking sample and hold units 47, 48. These form zone C of the circuit. Zone C forms a sampling device which continuously registers the running integral value which is then held when the current signal falls below the threshold. Thereafter the stored values are held for a further short period such as 0.1 ms before the sampling circuit zone C is released or reset. The outputs from the rectifiers 34, 41 are also fed to the sample and hold units 47, 48 whose outputs are fed to further sample and hold units 49, 50 which feed display means 51, 52. These comprise zone F and display the integral values of potential and current.

The sampled integral potential and current values from zone C are applied to a divider 53 whose output represents average resistance, which in turn is also sampled by a sample and hold unit 54, scaled by a scaling unit 55 and displayed by display means 56. In addition, the sampled integral current output from the sample and hold unit 48 is provided with a minimum level clamp by a signal clamp unit 57 to avoid spurious readings when the integral current is low or zero.

The integrators and peak sample and hold units require resetting to zero before each period of integration (giving controlled initial conditions for the integration). The reset should only be present when neither the enable signal nor the delay of zone C is operative. The sample and hold circuits 54, 49, and 50 are not reset to zero as they hold the value of average resistance between samples.

To obtain an indication of the average resistance for when the current is greater than say 50% of its maximum (that is over a period of several milliseconds embracing the current peak), one method is to detect when the rate of change of current has decreased below a threshold value. While the current is increasing towards its maximum and then decaying, the rate of change signal falls towards zero and increases again with the opposite polarity. For the integration method of determining average resistance, the integrator 33 can be initiated when the rate of change of current falls below a finite level and similarly the integrator can be stopped when the rate of change of current (i.e. toroid) signal has reached an equal and opposite value. The integral of the instantaneous potential registered over this period is then an index of the average resistance occurring. If this integral potential is divided by the corresponding integral of current, the quotient is proportional to the average resistance for that period.

To accommodate different ranges of current, the output from the toroid can be divided down to any convenient value to suit the threshold level detector which opens the gate to the integrator. In addition to confirm that the integration has been taken over the requisite period, a timer can also be started and stopped when the rate of change signal crosses the one threshold and subsequently crosses the equal and opposite threshold. The timer indicates the period over which the integration is taken, and the threshold levels and/or the fraction of the toroid voltage signal can be adjusted as desired to give integration over nominally say 1 ms, up to say 3 ms, around the current peak.

FIG. 10a illustrates a circuit suitable for use as the integrator 33 or the integrator 40. The circuit comprises input resistances 57, 58 to which the output from the respective switch range gain unit 32, 39 is fed. The output from the resistance 58 is fed to the negative input of an operational amplifier 59 mounted in parallel with a capacitor 60. A switch 61, which may be a conventional transistor switch is connected between the resistances 57, 58 so that on closure of the switch 61, the input to the operational amplifier 59 is short circuited. A switch 62, which may also be a conventional transistor switch, is connected in series with an output resistance 63 to the output of the operational amplifier 59. Closure of the switch 62 causes the integrator to be reset by discharging the capacitor 60.

Actuation of the switches 61,62 is effected by the threshold detector 45 in Zone E and the delay circuit 46 in Zone C. As may be seen in FIG. 10b, Zone E comprises a pair of comparators 64, 65 to which the current signal (A) is applied. The form of the current signal (A) is illustrated in FIG. 11. The output from the comparators 64, 65 which will be a square wave (B) is fed to one input of a NAND gate 66 and to one input of a NAND gate 67. A fixed potential is applied to the other input of the NAND gate 66. The output signal (C) from the NAND gate 66 is fed to the delay circuit 46. The Q output signal (E) from the delay 46 is fed to the instantaneous sample and hold units 49, 50,54 while the signal (C) is fed to the integrators 33, 40 where the "low" portion of the signal (C) causes closure of the switch 61. The $\bar{Q}$ output signal (D) from the delay circuit 46 is fed to the NAND gate 67 the output of which is fed to one input of a NAND gate 68. The other input of the NAND gate 68 is a constant potential and the output signal (F) from the NAND gate 68 is fed to the tracking sample and hold circuits 47,48 and to the integrators 33, 40 where the "low" portion of the signal (F) causes closure of the switch 62. The sample and hold circuits shown in FIG. 9 release the sample on receipt of the signal (F).

The integration approach is theoretically exact only when the integration is taken over the time period for which the current level at start and stop is identical in the current loop concerned. Therefore for greater accuracy, instead of relying on symmetry in the rate of change of current signal, the rate of change signal itself can be integrated, starting from the instant the signal passes the threshold value. The integration is then maintained until the signal integral itself returns to zero, which signifies that the starting and ending levels of current are the same. Again a timer can indicate the period of integration to confirm that it is over the nominal period desired.

In a further refinement of the technique, the time interval period can be used in a feedback loop such that the toroid signal is adjusted with respect to the threshold level until a preferred integration period, such as 2 ms about the current peak, is obtained. This automatic correction preferably operates over a long time constant, so that the toroid signal is not appreciably altered with respect to the threshold level from one current cycle to the next. As an example of automatic correction of the integration period, the error in the feedback loop can be used to drive a motor which in turn alters a potentiometer resistor governing the threshold level and/or the fraction of the toroid signal which determines the instant of initiation of the integration period. The motorised potentiometer then acts as a memory store of the preferred setting from one test (or one weld) to the next while being able to make minor adjustments if, for example, the overall current is drifting slightly with time due to a change in the mains supply voltage. A suitable rate of correction is 1 ms change in the effective integration period per second of continuous motor drive at its maximum rate, corresponding to a large error between the actual integration time and the preferred set time. In practice a preferred integration period is then established in about 10–30 seconds overall of continuous current flow (or the corresponding time interval for the equivalent sum of a sequence of current flows) to within the limits of error detection in the feedback correction circuit, or within 0.2 ms, whichever is the greater.

Instead of simply displaying the monitored potential or resistance, the respective signal can be used for control purposes. For example, in resistance welding an abnormally high potential reading indicates high interface resistance and in the extreme, where virtually no conductive contact is obtained, the value corresponds to a nominally open circuit condition, as with paint films or heavily contaminated surfaces. Similarly an abnormally low potential could indicate the absence of the work between the electrodes, that is to say where the electrodes have short-circuited together and missed the work to be welded, as can occur in unattended or robotic welding systems. Equally, apart from the detection of the normal rise and fall of potential (and hence resistance) corresponding to the development of a weld nugget, the value of resistance can serve to distinguish between whether two or more sheets are being welded simultaneously. This change in potential or resistance level can thus be used to adapt the welding schedule to suit the number of sheets being welded in a mixed combination of two sheets, three and four sheets together, and so forth.

Similarly a fall in potential or resistance from that expected with a given spot weld could serve as an indication of the occurrence of shunting (by another such spot weld close by) or partial shorting (as by the electrodes contacting other adjacent parts of the component to be spot welded), and the current increased to compensate as far as possible.

FIG. 7 illustrates schematically one method of utilising the measured resistance to control a resistance welding current. The signal representing resistance is fed along a line 69 to a pair of comparators 70, 71. These compare the signal on the line 69 with high and low references respectively and the output from each comparator is fed to a respective store 72, 73. The output signal from the gating system 22 is fed to a latch 74 and a NAND gate 75. The output from the NAND gate 75 is fed to the stores 72, 73 where it provides a clock signal input. The output from the stores 72, 73 and from the latch 74 are fed to a logic drive selector circuit 76 whose output is fed to a signal drive unit 77 which in turn controls a controller 78 which modulates the welding current. One output from the controller 78 is fed back to a reset circuit 79 whose output is fed to the stores 72, 73 and to the latch 74. Thus, each time a new weld is made by the welding machine, the stores and latch are reset. There are three conditions which this control circuitry can act upon. Firstly, the resistance signal on the line 69 may be greater than the "high" reference applied to the comparator 70; secondly, the signal on the line 69 may be less than the "high" reference but greater than the "low" reference input to the comparator 71; and thirdly the signal on the line 69 may be lower than the "low" reference input to the comparator 71.

For continuous operation as in seam and butt seam resistance welding the logic drive selector 76 compares the latest received signal on the line 69 with the previous signal and if they are different, that is they represent different conditions as previously outlined, an appropriate adjustment signal is applied to the signal drive 77. In this case the latch 74 and associated gate is reset as often as desired, such as every 1 second, by the machine controller 78 and the reset 79. If successive signals on the line 69 satisfy the same condition then no adjustment is made.

We claim:

1. A method of monitoring the resistance characteristics of a circuit carrying a current having at least an alternating component, the method comprising
   (a) monitoring the potential drop between two predetermined positions in said circuit;
   (b) monitoring said current flowing through said predetermined positions;
   (c) comparing said monitored current with a threshold;
   (d) determining at least two instants at which said monitored current reaches said threshold; and
   (e) determining one of the integral and the average of said monitored potential drop for the period between said instants, whereby said one of the integral and the average is representative of the resistance characteristic being monitored.

2. A method according to claim 1, further comprising obtaining one of the integral and the average of the current between said instants; and dividing the respective one of the integral and average potential by the corresponding one of the integral and average of the current and monitoring the result of the division.

3. A method according to claim 1, wherein the instants occur at successive times in the current loop when the current is substantially zero.

4. A method according to claim 3, wherein the current has an alternating component with a significant current zero period, the method comprising determining said integral between successive instants each falling within the current zero period of a successive pair of said current zero periods.

5. A method according to claim 1, wherein the instants occur at successive times in the current loop when the current value is substantially the same and non-zero.

6. A method according to claim 5, wherein the interval between the instants lies in the range of 1-3 milliseconds.

7. A method according to claim 5, wherein the interval between the instants is less than 0.3 milliseconds.

8. A method according to claim 1, wherein said instants are separated by not more than five electrical degrees.

9. A method of monitoring the resistance characteristics of a circuit carrying a current having at least an alternating component, the method comprising
   (a) monitoring the potential drop between two predetermined positions in said circuit;
   (b) monitoring the rate of change of said current flowing through said predetermined positions;
   (c) comparing said monitored rate of change with a pair of thresholds at which said current has the same value;
   (d) determining the instants at which said monitored rate of change reaches said thresholds; and
   (e) determining one of the integral and the average of said monitored potential drop for the period between said instants, whereby said one of the integral and the average is representative of the resistance characteristic being monitored.

10. A method according to claim 9, further comprising obtaining one of the integral and the average of the current between said instants; and dividing the respective one of the integral and average potential by the corresponding one of the integral and average of the current and monitoring the result of the division.

11. A method according to claim 9, wherein the instants occur at successive times in the current loop when the current is substantially zero.

12. A method according to claim 9, wherein the interval between the instants lies in the range 1-3 milliseconds.

13. A method according to claim 9, wherein the interval between the instant is less than 0.3 milliseconds.

14. A method according to claim 13, wherein the interval between the instants is substantially 45 microseconds.

15. A method according to claim 9, wherein said instants are separated by not more than five electrical degrees.

16. A method of resistance welding, the method comprising applying a current having at least an alternating component between a pair of electrodes positioned adjacent a workpiece or workpieces to be welded; and monitoring resistance characteristics of the circuit carrying the current by a method comprising:
   (a) monitoring the potential drop between two predetermined positions in said circuit;
   (b) monitoring said current flowing through said predetermined positions;
   (c) comparing said monitored current with a threshold;
   (d) determining at least two instants at which said monitored current reaches said threshold; and
   (e) determining one of the integral and the average of said monitored potential drop for the period between said instants, whereby said one of the integral and the average is representative of the resistance characteristic being monitored.

17. A method according to claim 16, wherein said predetermined positions in the circuit are remote from said electrodes.

18. A method according to claim 16, further comprising controlling said current in response to said monitored resistance characteristics.

19. A method according to claim 16, wherein the method of resistance welding is one of continuous seam welding and butt seam welding.

20. A method of resistance welding, the method comprising applying a current having at least an alternating component between a pair of electrodes positioned adjacent a workpiece or workpieces to be welded; and monitoring resistance characteristics of the circuit carrying the current by a method comprising:
   (a) monitoring the potential drop between two predetermined positions in said circuit;
   (b) monitoring the rate of change of said current flowing through said predetermined positions;
   (c) comparing said monitored rate of change with a pair of thresholds at which said current has the same value;
   (d) determining the instants at which said monitored rate of change reaches said thresholds; and
   (e) determining one of the intregral and the average of said monitored potential drop for the period between said instants, whereby said one of the integral and the average is representative of the resistance characteristic being monitored.

21. A method according to claim 20, wherein said predetermined positions in the circuit are remote from said electrodes.

22. A method according to claim 20, further comprising controlling said current in response to said monitored resistance characteristics.

23. A method according to claim 20, wherein the method of resistance welding is one of continuous seam welding and butt seam welding.

24. Apparatus for monitoring the resistance characteristics of a circuit carrying a current having at least an alternating component, the apparatus comprising means for monitoring said current flowing between two predetermined positions in said circuit; comparison means for comparing said monitored current with a threshold and for determining at least two instants at which said monitored current reaches said threshold; and one of first integration means and first averaging means for integrating or averaging respectively the potential drop between said two predetermined positions in said circuit for the period between said instants to generate an output signal representative of the resistance characteristics being monitored.

25. Apparatus according to claim 24, further comprising one of second integration means and second averaging means for integrating or averaging respectively the current between said instants to provide an output signal related to said one of said integrated and averaged current; and means for dividing the output signal from said one of said first integration means and said first averaging means by the output signal from said one of said second integration means and said second averaging means and for providing an output signal.

26. Resistance welding apparatus including apparatus according to claim 24; a pair of electrodes in said circuit to which said current is applied; and means for detecting said output signal and for modulating said current in response to said detected output signal.

27. Resistance welding apparatus according to claim 26, wherein said predetermined positions are remote from said electrodes.

28. Apparatus for monitoring the resistance characteristics of a circuit carrying a current having at least an alternating component, the apparatus comprising means for monitoring the rate of change of said current flowing through two predetermined positions; comparison means for comparing said monitored rate of change with a pair of thresholds at which said current has the same value and for determining instants at which said rate of change reaches said thresholds; and one of first integration means and first averaging means for integrating or averaging respectively the potential drop between said two predetermined positions in said circuit for the period between said instants to generate an output signal representative of the resistance charateristic being monitored.

29. Apparatus according to claim 28, further comprising one of second integration means and second averaging means for integrating or averaging respectively the current between said instants to provide an output signal related to said one of said integrated and averaged current; and means for dividing the output signal from said one of said first integration means and said first averaging means by the output signal from said one of said second integration means and said second averaging means and for providing an output signal.

30. Resistance welding apparatus including apparatus according to claim 28; a pair of electrodes in said circuit to which said current is applied; and means for detecting said output signal and for modulating said current in response to said detected output signal.

* * * * *